(12) United States Patent
Sayed et al.

(10) Patent No.: US 7,073,113 B2
(45) Date of Patent: Jul. 4, 2006

(54) ADAPTIVE SIGMA-DELTA MODULATION WITH IMPROVED DYNAMIC RANGE

(75) Inventors: Ali H. Sayed, Los Angeles, CA (US); Mansour A. Aldajani, Los Angeles, CA (US)

(73) Assignee: The Regents of the University of California, Oakland, CA (US)

(*) Notice: Subject to any disclaimer, the term of this patent is extended or adjusted under 35 U.S.C. 154(b) by 514 days.

(21) Appl. No.: 10/332,750

(22) PCT Filed: Jul. 13, 2001

(86) PCT No.: PCT/US01/22193

§ 371 (c)(1),
(2), (4) Date: Jan. 13, 2003

(87) PCT Pub. No.: WO02/09292

PCT Pub. Date: Jan. 31, 2002

(65) Prior Publication Data

US 2004/0128606 A1    Jul. 1, 2004

Related U.S. Application Data

(60) Provisional application No. 60/218,103, filed on Jul. 13, 2000.

(51) Int. Cl.
*G06F 11/00* (2006.01)
(52) U.S. Cl. ............... 714/746; 341/143; 341/155; 714/799

(58) Field of Classification Search .......... 714/746, 714/799, 812, 817; 341/143, 155, 118; 375/244
See application file for complete search history.

(56) References Cited

U.S. PATENT DOCUMENTS 5,331,111 A * 7/1994 O'Connell ............... 84/602
6,339,621 B1    1/2002 Cojocaru et al.

FOREIGN PATENT DOCUMENTS

JP    06219530    9/1994

OTHER PUBLICATIONS

M.A. Aldajani et al., "An Adaptive Structure for Sigma Delta Modulation with Improved Dynamic Range," XP-002245293, Proc. 43$^{rd}$ IEEE, pp. 390-394.

(Continued)

*Primary Examiner*—Albert Decady
*Assistant Examiner*—Dipakkumar Gandhi
(74) *Attorney, Agent, or Firm*—Gates & Cooper LLP (57) ABSTRACT

An adaptive sigma-delta modulation and demodulation technique, wherein a quantizer step-size is adapted based on estimates of an input signal to the quantizer, rather than on estimates of an input signal to the modulator.

22 Claims, 9 Drawing Sheets

OTHER PUBLICATIONS

J. Yu et al., "Adaptive quantisation for one-bit sigma-delta modulation," IEE Proceedings-G 139(1), Feb. 1992.

C.V. Chakravarthy, "An amplitude-controlled adaptive delta sigma modulator," The Radio and Electronic Engineer 49(1), 49-54, Jan. 1979.

C. Dunn et al., "Fixed and Adaptive Sigma-Delta Modulators with Multibit Quantisers," Applied Sig Process 3:212-222, 1996.

M.P. Jaggi et al., "Instantaneously adaptive delta sigma modulator," Can. Elec. Eng. J. 11(1) 1986.

* cited by examiner

ADAPTIVE SIGMA-DELTA MODULATION WITH IMPROVED DYNAMIC RANGE

CROSS-REFERENCE TO RELATED APPLICATIONS

This application claims priority under 35 U.S.C. § 119(e) to U.S. Provisional Patent Application No. 60/218,103, filed Jul. 13, 2000, by Ali H. Sayed and Mansour A. Aldajani, entitled "STRUCTURE FOR ADAPTIVE SIGMA-DELTA MODULATION WITH IMPROVED DYNAMIC RANGE," which application is incorporated by reference herein.

BACKGROUND OF THE INVENTION

1. Field of the Invention

The present invention relates to analog-to-digital converters, and in particular, to a structure for adaptive sigma-delta modulation with improved dynamic range.

2. Description of the Related Art (Note: This application references a number of different publications as indicated throughout the specification by reference numbers enclosed in brackets, e.g., [x]. A list of these different publications ordered according to these reference numbers can be found below in the Section entitled "Publications" in the Detailed Description of the Preferred Embodiment. Each of these publications is incorporated by reference herein.)

Analog-to-digital converters (ADCs) nowadays use an innovative technology known as sigma-delta modulation (SDM) to perform the conversion process. Sigma-delta modulators/demodulators are known to provide a high-resolution digital representation of analog signals. Moreover, sigma-delta modulators/demodulators show high robustness to circuit imperfections, which makes them attractive for low-cost and reliable implementations. Sigma-delta modulation achieves high resolution data conversion via noise shaping. Current sigma-delta modulators/demodulators can provide up to 20+ bits of resolution.

Figure 1A:
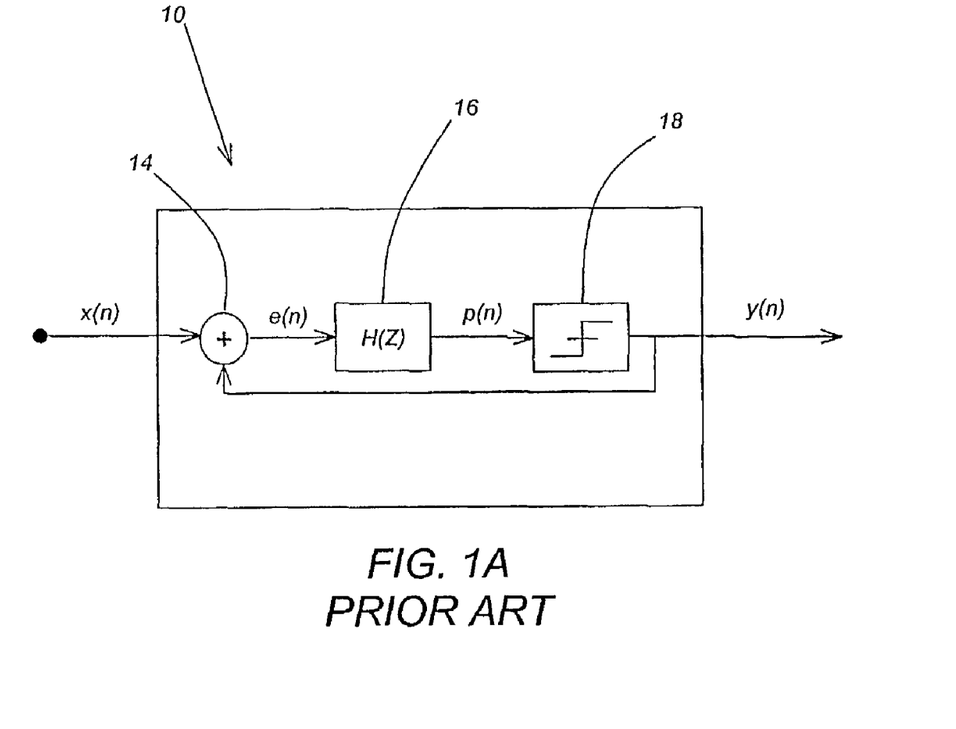
FIGS. 1A and 1B illustrate a modulator and demodulator of a single-loop prior art implementation of sigma-delta modulation.
Figure 1B:
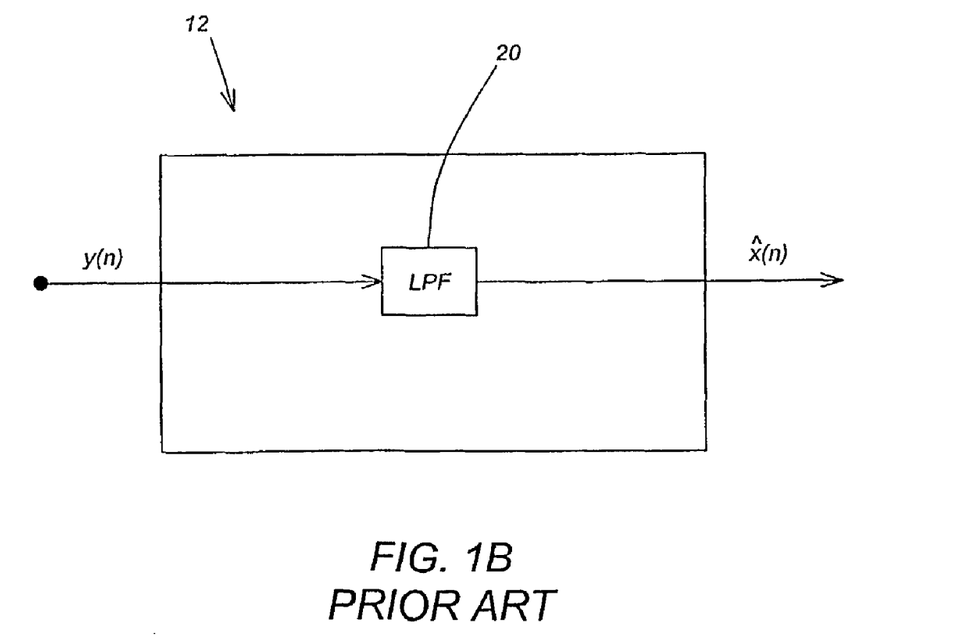

FIGS. 1A and 1B illustrate a modulator 10 and demodulator 12 of a single-loop prior art implementation of sigma-delta modulation. In this example, the modulator 10 is comprised of a summing junction 14, noise shaping filter 16, and single-bit quantizer 18, while the demodulator 12 is comprised of a low-pass filter 20. Other implementations may include multi-loop, multi-stage, and multi-bit structures.

In the modulator 10, a sampled analog input signal x(n) is compared with the output of the modulator y(n). The comparison error is filtered at the filter 16 and then converted into a binary output signal y(n) having a specified number of bits at the quantizer 18. The binary output signal y(n) is a representation of the analog input signal x(n) contaminated with noise created by the quantizer 18. The low-pass filter 20 in the demodulator 12 filters out a shaped quantization signal from the binary output signal y(n), thereby resulting in a good approximation ($\hat{x}(n)$) of the analog input signal x(n).

In sigma-delta modulation, the signal-to-noise ratio (SNR) decreases linearly with the amplitude of the input signal. The dynamic range of the modulator 10 is a measure of how much the amplitude of the input signal can be reduced before the SNR becomes unity. A typical dynamic range for sigma-delta modulation is from 70 to 150 dB.

Adaptive sigma-delta modulation (ASDM) increases the dynamic range of sigma-delta modulation by scaling either the input signal or the step-size of the quantizer through an estimation of the input signal strength. This estimate can be made from the input signal itself or from the modulator output.

Figure 2A:
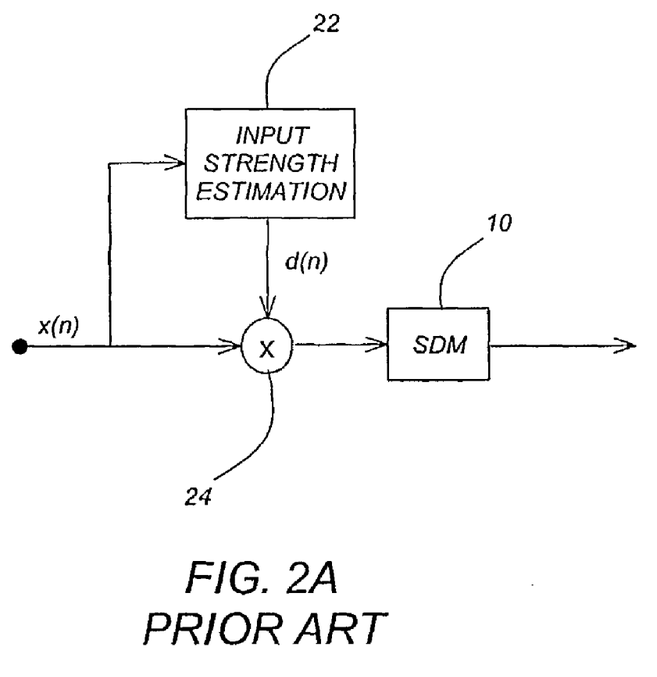
Figure 2B:
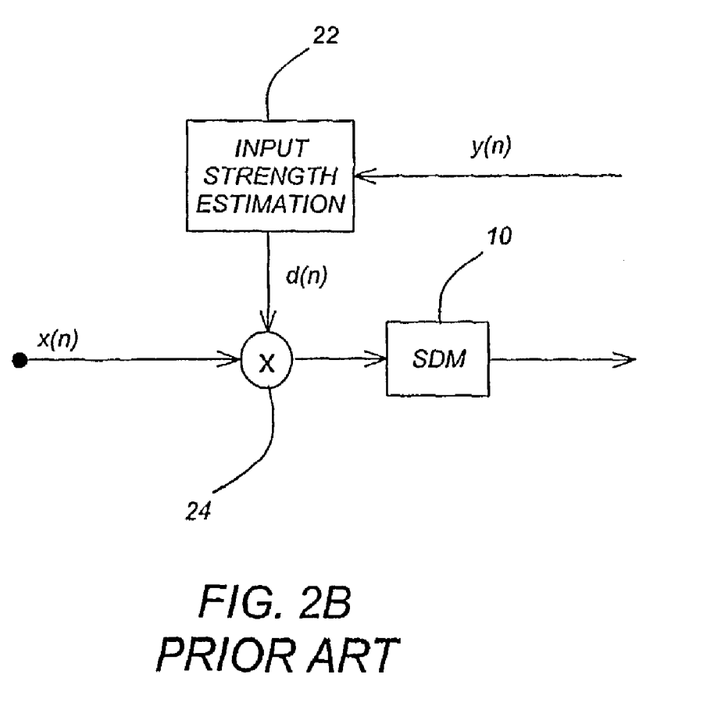
Figure 2C:
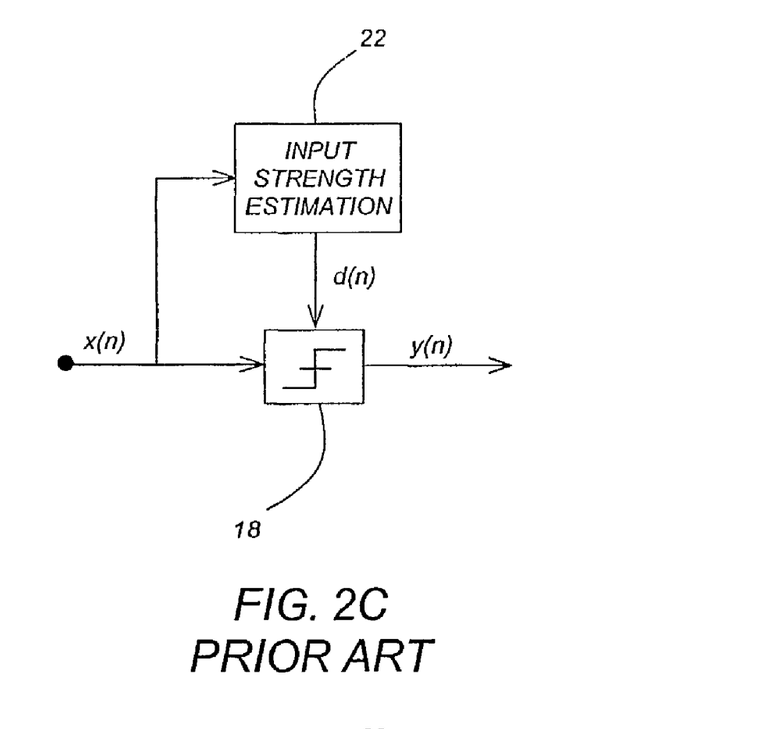
Figure 2D:
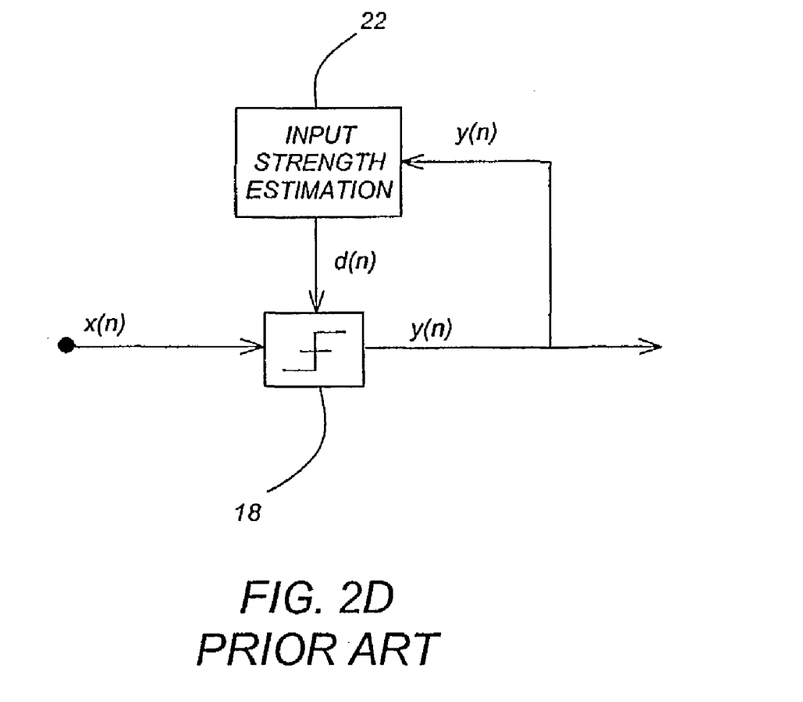

FIGS. 2A–D illustrate prior art adaptation schemes using input and output information, wherein FIGS. 2A and 2B show input scaling using an input strength estimation 22 at a multiplier 24, while FIGS. 2C and 2D show quantizer step-size scaling using an input strength estimation 22 that controls the quantizer 18. Using the input signal to perform the estimation is known as forward estimation, while using the output signal is known as backward estimation.

Adaptation could be done continuously or sporadically in time. Moreover, the value of the scaling signal d(n) could be continuous in amplitude or restricted to a specific range of values.

Several adaptation techniques have been investigated in the literature [2–6]. Chakravarthy [2] proposed an adaptive scheme that is based on averaging the number of transitions at the modulator output. Jaggi and Chakravarthy [3] used a digital-to-analog converter to instantaneously control the feedback pulse amplitude. Yu et. al. [4] developed a technique based on estimating the maximum input amplitude over a certain interval and using it to adapt the quantization step-size. This work has been extended by Dunn and Sandler [5] to a multi-bit quantizer, while Ramesh and Chao [6] implemented a backward adaptation.

Some the limitations of these techniques include: (1) stability is not guaranteed; (2) they still provide limited dynamic range; and (3) most of these techniques involve complicated logic. Consequently, there is a still a need in the art for improved techniques for adaptive sigma-delta modulation.

SUMMARY OF THE INVENTION

To overcome the limitations in the prior art described above, and to overcome other limitations that will become apparent upon reading and understanding the present specification, the present invention discloses an adaptive sigma-delta modulation and demodulation technique, wherein a quantizer step-size is adapted based on estimates of an input signal to the quantizer, rather than on estimates of an input signal to the modulator.

BRIEF DESCRIPTION OF THE DRAWINGS

Referring now to the drawings in which like reference numbers represent corresponding parts throughout:

FIGS. 2A–D illustrate prior art adaptation schemes using input and output information, wherein FIGS. 2A and 2B show input scaling using an input strength estimation, while FIGS. 2C and 2D show quantizer step-size scaling using an input strength estimation that controls a quantizer;

DETAILED DESCRIPTION OF PREFERRED EMBODIMENT

In the following description, reference is made to the accompanying drawings which form a part hereof, and which show, by way of illustration, a preferred embodiment of the present invention. It is understood that other embodiments may be utilized and structural changes may be made without departing from the scope of the present invention.

Overview

The present invention provides a novel structure for adaptive sigma-delta modulation that leads to considerable improvement in the dynamic range of the modulator. The quantizer step-size is adapted based on estimates of the input signal to the quantizer, rather than on estimates of the input signal to the modulator itself, as is common in prior art schemes. The proposed adaptive scheme can be implemented directly by means of analog switches. Simulation results show considerable improvement in signal-to-noise ratio (SNR) performance, especially for small amplitude signals, over existing adaptive sigma-delta modulators.

Modulator and Demodulator Structures

Figure 3A:
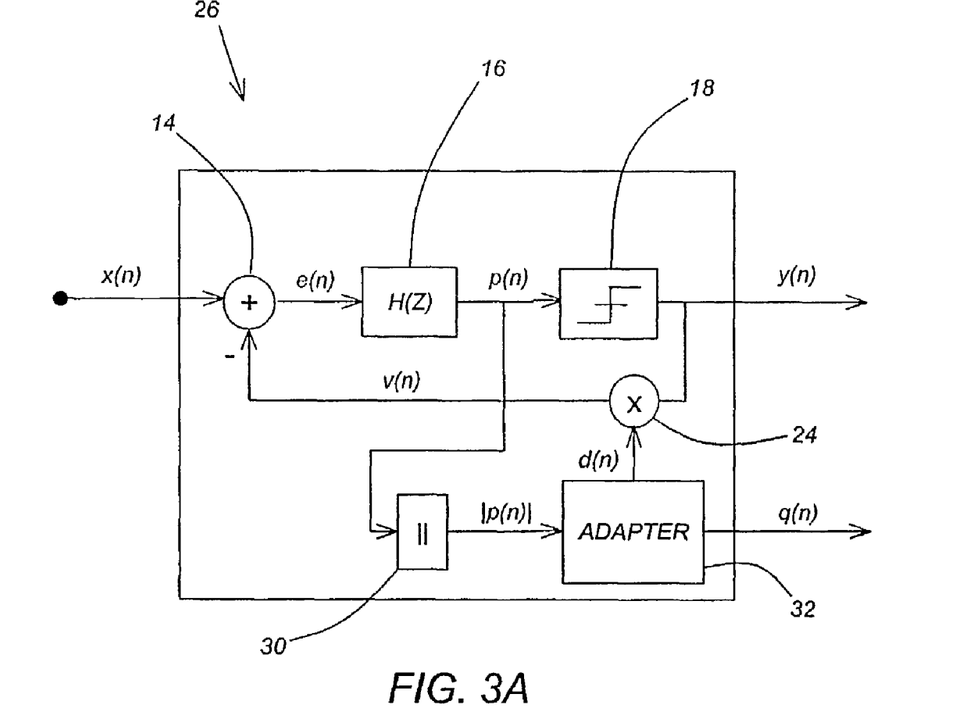
FIGS. 3A and 3B are block diagrams illustrating new structures for adaptive sigma-delta modulation and demodulation, wherein a modulator is shown in FIG. 3A and a demodulator is shown in FIG. 3B.
Figure 3B:
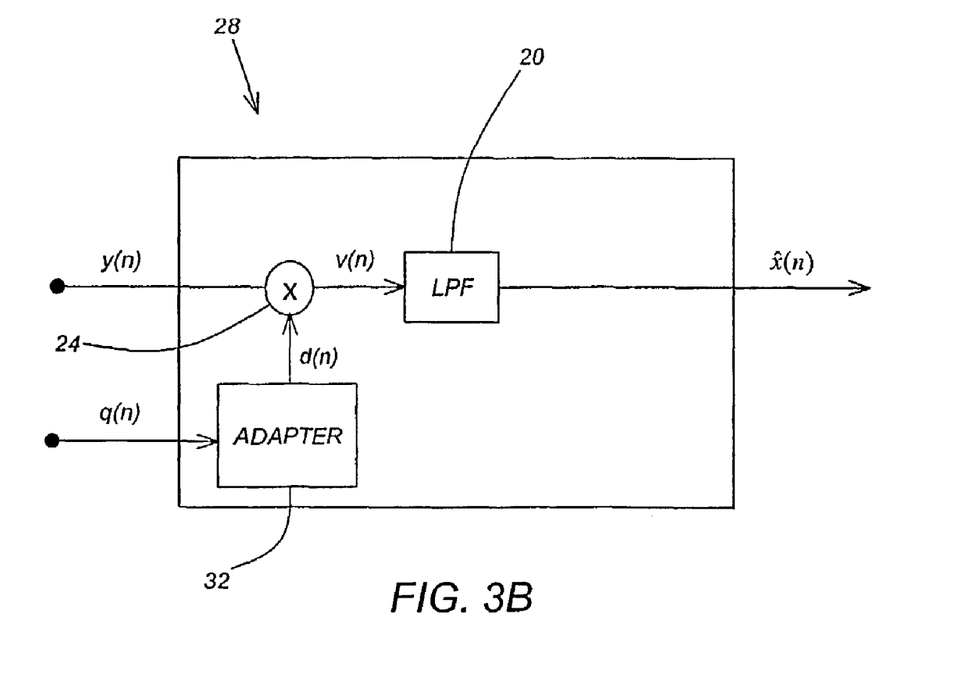

FIGS. 3A and 3B are block diagrams illustrating new structures for adaptive sigma-delta modulation and demodulation, wherein a modulator 26 is shown in FIG. 3A and a demodulator 28 is shown in FIG. 3B.

As shown in FIG. 3A, the modulator 26 is comprised mainly of two parts: a conventional sigma-delta modulation part, and a step-size adaptation part. The sigma-delta modulation part is similar in function to the sigma-delta modulation described in conjunction with FIGS. 1A and 1B, and includes a summing junction 14, filter 16, and quantizer 18, wherein the difference between a sampled analog input signal x(n) and a modulator's output v(n) is filtered by the filter 16 and converted into a binary output signal y(n) having a specified number of bits at the quantizer 18. The binary output signal y(n) is a representation of the analog input signal x(n) contaminated with noise created by the quantizer 18.

The step-size adaptation part includes an absolute value block 30, adapter 32, and multiplier 24, wherein the step-size of the quantizer 18 is adapted based on estimates of absolute value of the signal p(n), where p(n) is the input to the quantizer 18. The absolute value block 30 generates the absolute value of the signal |p(n)| to the quantizer 18. The adapter 32 uses this signal to produce both a scaling signal d(n), which is an approximation of the signal |p(n)|, and a binary sequence signal q(n), from which the signal d(n) can be re-generated. The scaling signal d(n) is multiplied by the binary output signal y(n) at multiplier 24 to create an encoded signal v(n):

$$v(n)=y(n)d(n)$$

The encoded signal v(n) is subtracted from the analog input signal x(n) at summing junction 14 to generate an error signal e(n):

$$e(n)=x(n)-v(n)$$

The error signal e(n) is then passed through the noise shaping filter 16, and the signal p(n) is output from the filter 16. The signal p(n) is quantized using a one-bit quantizer 18 to produce the binary output signal y(n).

As shown in FIG. 3B, the demodulator 28 is also comprised mainly of two parts: a conventional sigma-delta demodulation part, and a step-size adaptation part. The sigma-delta demodulation part is similar in function to the sigma-delta demodulation described in conjunction with FIGS. 1A and 1B, and includes a low pass filter 20 that filters out a shaped quantization signal from the binary output signal y(n), thereby resulting in a good approximation ($\hat{x}(n)$) of the original analog input signal x(n). Similar to the modulator 26, the step-size adaptation part includes a multiplier 24 and adapter 32, wherein the adapter 32 accepts the signal q(n) from the modulator 26 and generates the scaling signal d(n) to vary the step-size of the demodulation.

Adapter Structure

Figure 4:
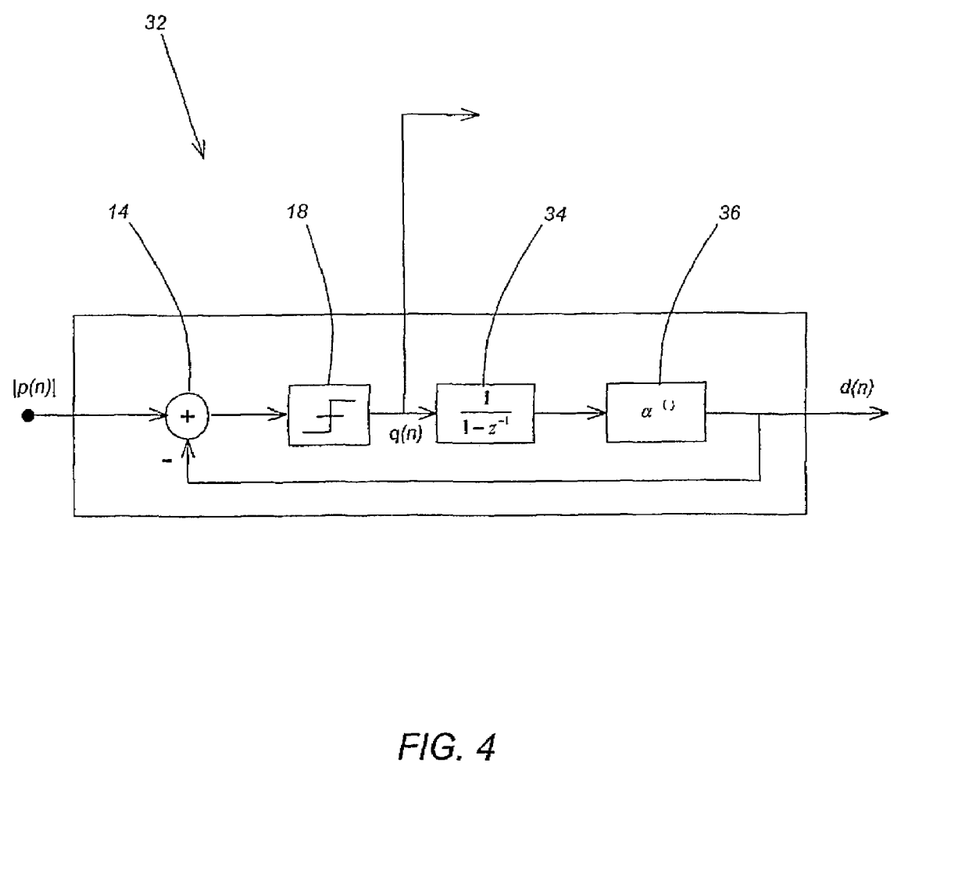
FIG. 4 is a block diagram that shows the implementation of an adapter used to perform the approximation of the quantizer input according to the preferred embodiment of the present invention.

FIG. 4 is a block diagram that shows the adapter 32 used to perform the approximation of the quantizer 18 input. The adapter 32 includes a summing junction 14, quantizer 18, integrator 34, and exponential term block 36. The adapter 32 is itself a delta modulator with an additional exponential term block 36. This additional block boosts the tracking capability of the adapter 32.

In the adapter 32, the scaling signal d(n) is subtracted from the signal |p(n)| at summing junction 14. The scaling signal d(n) is given by:

$$d(n)=\alpha^{q(n)}d(n-1)$$

where the binary sequence signal q(n) is generated from:

$$q(n) = \begin{cases} +1, & \text{if } |p(n)| > d(n-1) \\ -1, & \text{otherwise} \end{cases}$$

The scaling signal d(n) is used to vary the step-size of the sigma-delta modulation part. Notice that if d(n)=|p(n)|, then the quantization effect will be canceled exactly.

The output from the summing junction 14 is then quantized by the quantizer 18, which outputs the binary sequence signal q(n). The integrator 34 integrates the binary sequence signal q(n) and exponential term block 36 converts the binary sequence signal q(n) to the scaling signal d(n), which is used to vary the step-size of the sigma-delta modulation part, as described above.

Consequently, the adapter 32 provides the following properties:

1. It provides reasonable approximator of highly varying signals. The additional exponential term block 36 boosts the tracking performance of the sigma-delta modulation, making it more suitable for highly varying signals.

2. The adapter 32 can be implemented using a simple switching circuit.

3. Because its scaling signal d(n) is always non-negative, the adapter 32 works for non-negative inputs.

4. The adapter 32 is shown to be functionally equivalent to delta modulation preceded with a logarithmic block and followed by the exponential block 36.

5. It can be shown that the adapter 32, together with the quantizer 18, can be replaced by a scalar variable gain (not shown). The scalar variable gain is a function of only the quantization noise of the quantizer 18 inside the adapter 32.

6. Analysis has shown that using property #6 above, the performance of the modulator 26 is independent of the input signal variance, resulting in a theoretically infinite dynamic range.

Signal-to-Noise Ratio

Figure 5:
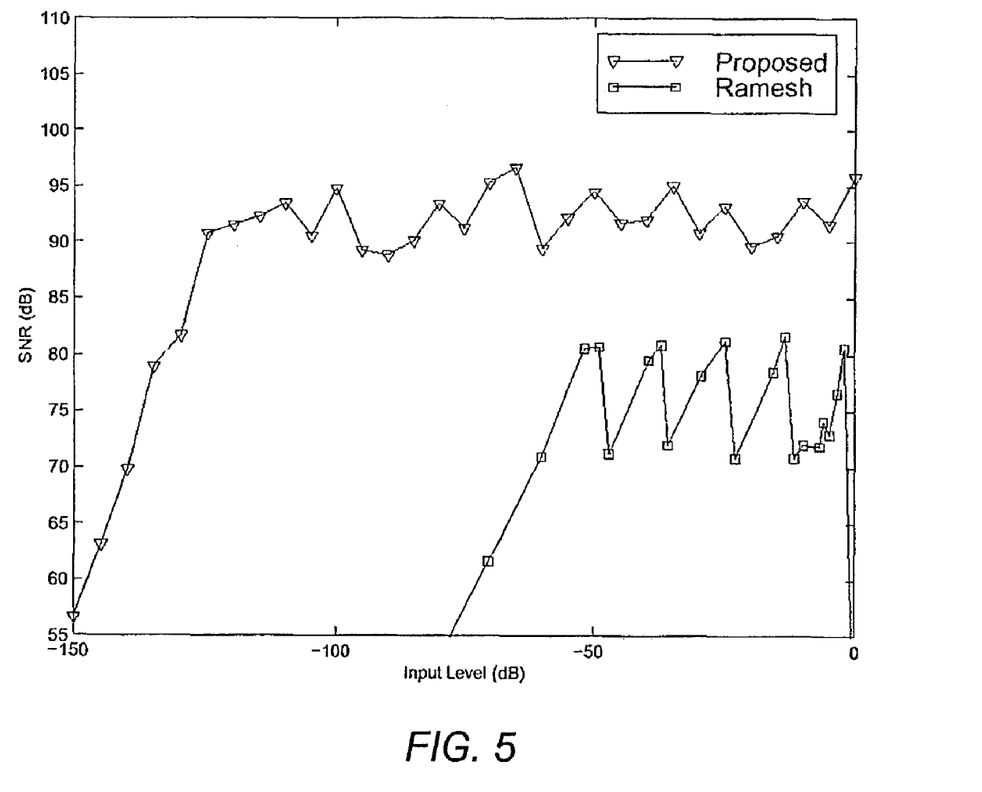
FIG. 5 shows a simulation of the signal-to-noise ratio performance versus input level of the modulator for sinusoidal inputs with different magnitudes.

FIG. 5 shows a simulation of the signal-to-noise ratio performance versus input level of the modulator 26 for sinusoidal inputs with different magnitudes. The plot includes the results obtained by [6] for the sake of comparison. As is clear from the figure, the new modulator 26 shows a better signal-to-noise ratio performance and superior dynamic range performance.

Design Considerations

Figure 6A:
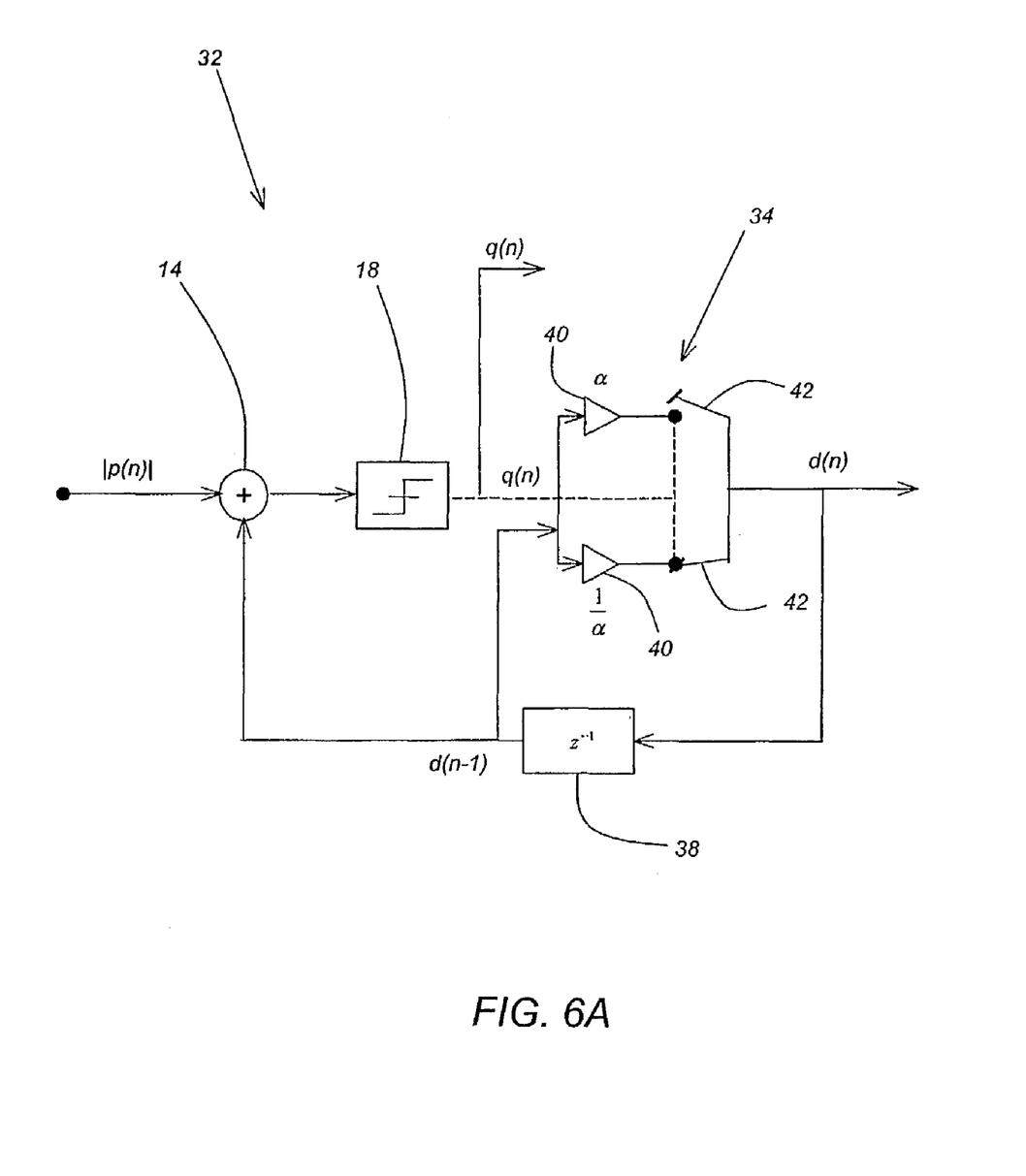
FIGS. 6A, 6B, and 6C are block diagrams that illustrate the implementation of three nonlinear blocks in the modulator according to the preferred embodiment of the present invention.
Figure 6B:
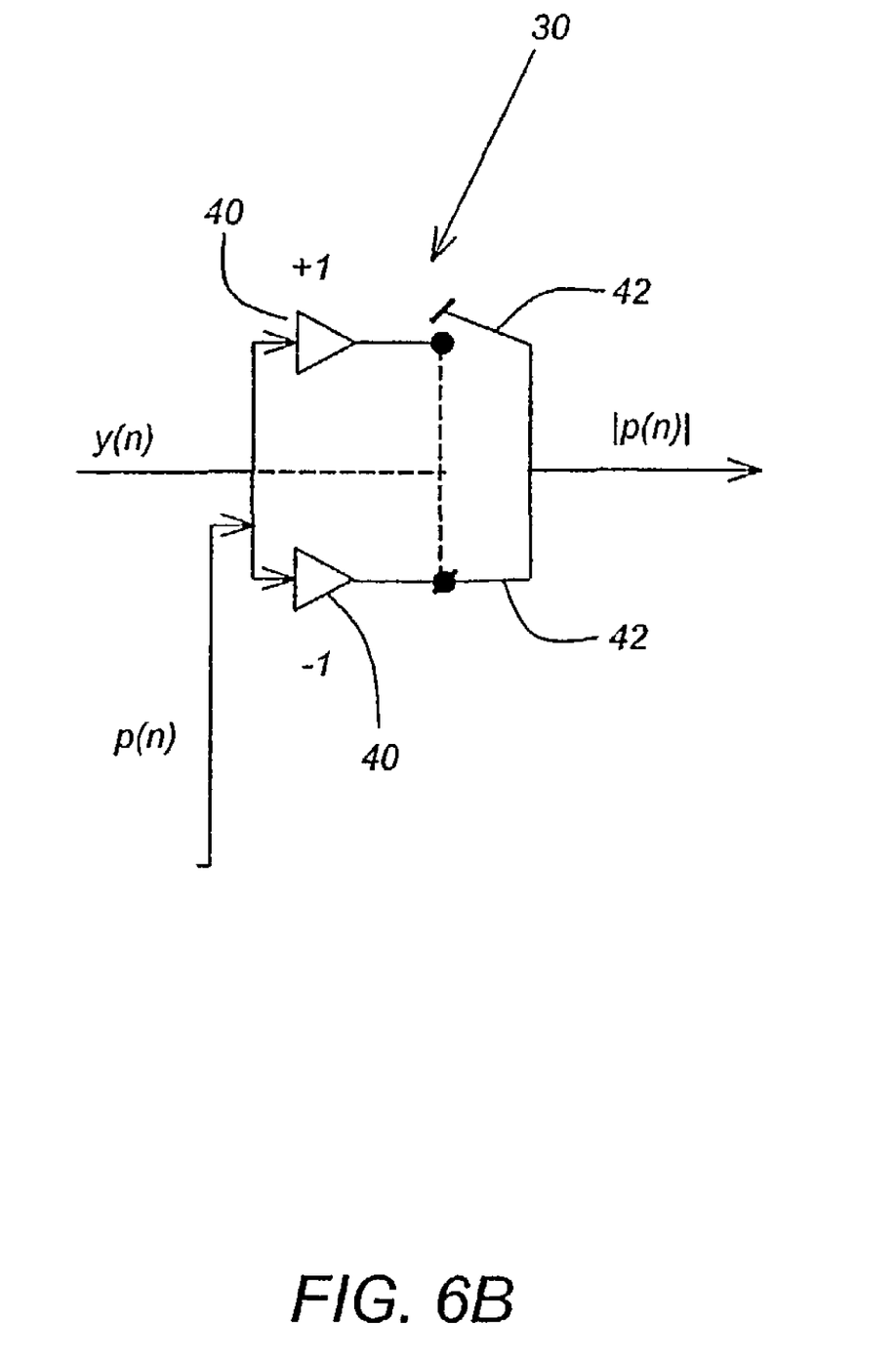
Figure 6C:
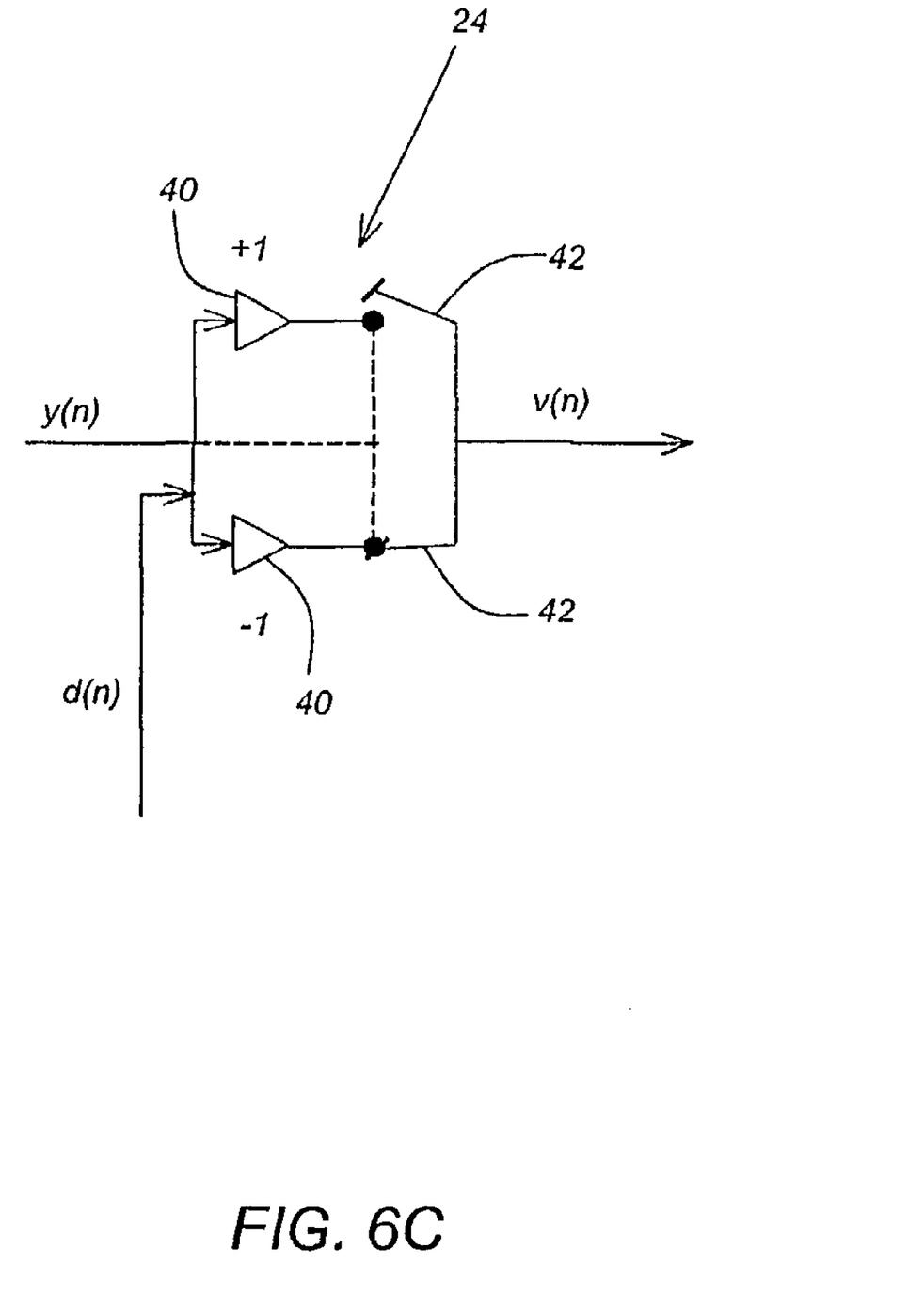

As noted in FIGS. 3A and 4, there are three nonlinear blocks in the modulator 26, namely, exponential term block 36, absolute value term 30, and multiplier 24. These nonlinear blocks can be built using simple switching circuits. FIGS. 6A, 6B and 6C show how these blocks could be implemented making use of other signals inside the modulator 26 itself.

FIG. 6A illustrates the structure of the adapter 32, and more specifically, the exponential term block 36. The exponential term block 36 includes a delay 38, two op-amps 40 that generate both $\alpha$ and $1/\alpha$, as well as switches 42 for selecting among the two op-amps 40. The choice between the two gains $\alpha$ and $1/\alpha$ depends on the value of the binary sequence signal q(n), as follows:

$$d(n) = \begin{cases} \alpha\ d(n-1), & \text{if } q(n) = +1 \\ \frac{1}{\alpha}\ d(n-1), & \text{if } q(n) = -1 \end{cases}$$

FIG. 6B illustrates the structure of the absolute value term 30. The absolute value term 30 also includes two op-amps 40 with gains +1 and −1, as well as switches 42 for selecting among the two op-amps 40. The choice between the two gains +1 or −1 depends on the sign of p(n), or equivalently, the state of the binary output signal y(n). In other words, the absolute value term 30 implements the following equation:

$$|p(n)| = \begin{cases} +p(n), & \text{if } y(n) = +1 \\ -p(n), & \text{if } y(n) = -1 \end{cases}$$

Finally, FIG. 6C illustrates the structure of the multiplier 24, which multiplies the scaling signal d(n) with the binary output signal y(n). The multiplier 24 also includes two op-amps 40 with gains +1 and −1, as well as switches 42 for selecting among the two op-amps 40. Thus, the multiplier 24 is controlled by the binary output signal y(n) to maintain or invert the sign of the scaling signal d(n) as follows:

$$v(n) = \begin{cases} +d(n), & \text{if } y(n) = +1 \\ -d(n), & \text{if } y(n) = -1 \end{cases}$$

Bandwidth Considerations

As is the case for all sigma-delta modulation, the modulator 26 and demodulator 28 of the present invention work with over-sampled input signals. With current technology, the modulator 26 and demodulator 28 are ideal for all low to medium-band devices.

Examples of such applications include speech and low-rate image coding and instrumentation. However, it is expected that the modulator 26 and demodulator 28 of the present invention will also be used for even higher bandwidth applications.

Advantages over Existing Practices

The modulator 26 and demodulator 28 of the present invention offers the following advantages over prior art implementations of adaptive sigma-delta modulation:

1. The modulator 26 and demodulator 28 of the present invention show a much higher dynamic range than prior art implementations of adaptive sigma-delta modulation. This makes the modulator 26 and demodulator 28 attractive for applications involving signals with high variations such as speech signals. The signal-to-noise ratio provided by the modulator 26 and demodulator 28 is shown to be ideally independent of the input signal variance. Moreover, the signal-to-noise ratio value provided by the modulator 26 and demodulator 28 equals to the peak signal-to-noise ratio provided by conventional implementations of sigma-delta modulation.

2. The modulator 26 and demodulator 28 of the present invention are proved to be BIBO (Bounded Input Bounded Output) stable.

3. The modulator 26 and demodulator 28 of the present invention are easy to implement using simple switching devices.

Potential Applications

The present invention can be used in a wide variety of applications. Examples of such applications include, but are not limited to:

1. instrumentation,
2. control systems,
3. automatic testing equipment,
4. voice-band codecs for wired and wireless telephone systems,
5. Internet transmission systems such as ISDN,
6. modems,
7. compact disks,
8. audio recording and digital audio tapes (DAT),
9. digital radio,
10. video transmission and processing,
11. storage oscilloscopes,
12. consumer home electronics, and
13. automotive and aircraft electronic sensory systems.

Publications

The following publications are incorporated by reference herein:

[1] Norsworthy, S., Schreier, R., and Temes, G., Delta-Sigmna Data Converters, IEEE Circuits and Systems Society, IEEE Press, NJ, 1997.

[2] Chakravarthy, C., "An amplitude controlled adaptive delta sigma modulators," Radio and Electronic Engineering, Vol. 49, No. 1, pp. 49–54, January 1979.

[3] Jaggi, M. and Chalravarthy, C., "Instantaneous adaptive delta sigma modulator," Canadian Electrical Engineering Journal, Vol. 11, No. 1, pp. 3–6, January 1986.

[4] Yu, J., Sandler, M., and Hwaken, R., "Adaptive quantization for one bit delta sigma modulation," IEEE Proceedings G (Circuits, Devices and Systems), Vol. 139, No. 1, pp. 39–44, February 1992.

[5] Dunn, C. and Sandler, M., "Fixed and adaptive sigma-delta modulator with multibit quantizers," Applied signal processing, Vol. 3, No. 4, pp. 212–222, 1996.

[6] Ramesh, M. and Chao, K., "Sigma-delta analog to digital converters with adaptive quantization," Proceedings of Midwest Symposium on Circuits and Systems, IEEE, Vol. 1.2, pp. 22–25, 1998.

Conclusion

This concludes the description including the preferred embodiments of the present invention. The foregoing description of the preferred embodiment of the invention has been presented for the purposes of illustration and description. It is not intended to be exhaustive or to limit the invention to the precise form disclosed. Many modifications and variations are possible in light of the above teaching.

It is intended that the scope of the invention be limited not by this detailed description, but rather by the claims appended hereto. The above specification, examples and data provide a complete description of the manufacture and use of the composition of the invention. Since many embodiments of the invention can be made without departing from the spirit and scope of the invention, the invention resides in the claims hereinafter appended.

What is claimed is:

1. An apparatus for adaptive sigma-delta modulation, comprising:
   (a) a summing junction for comparing an analog input signal x(n) to an encoding signal v(n) to generate an error signal e(n) representing a difference between the analog input signal x(n) and the encoding signal v(n);
   (b) a noise shaping filter for filtering the error signal e(n) to generate a signal p(n);
   (c) an absolute value block for generating an absolute value of the signal p(n);
   (d) a first one-bit quantizer for converting the signal p(n) into a binary output signal y(n);
   (e) an adapter for generating a scaling signal d(n) for scaling a step-size of the first one-bit quantizer using an estimation of the absolute value of the signal p(n), wherein the adapter comprises:
      (1) a summing junction for subtracting the scaling signal d(n) from the absolute value of the signal p(n) to generate an output signal;
      (2) a second one-bit quantizer for converting the output signal from the summing junction into a binary sequence signal q(n);
      (3) an integrator for integrating the binary sequence signal q(n); and
      (4) an exponential term block for converting the integrated binary sequence signal q(n) to the scaling signal d(n); and
   (f) a multiplier for multiplying the binary output signal y(n) by the scaling signal d(n) to generate the encoding signal v(n).

2. The apparatus of claim 1, wherein the binary output signal y(n) is a representation of the analog input signal x(n) contaminated with noise created by the first one-bit quantizer.

3. The apparatus of claim 1, wherein the adapter produces both the scaling signal d(n), which is an approximation of the absolute value of the signal p(n), and a binary sequence signal q(n) from which the scaling signal d(n) can be re-generated.

4. The apparatus of claim 1, wherein the scaling signal d(n) is used to vary the step-size of the first one-bit quantizer.

5. The apparatus of claim 1, wherein the scaling signal d(n) is an approximation of an amplitude of the signal p(n).

6. The apparatus of claim 1, wherein the scaling signal d(n) comprises:

$$d(n) = \alpha^{q(n)} d(n-1)$$

7. The apparatus of claim 1, wherein the scaling signal d(n) comprises:

$$d(n) = \begin{cases} \alpha d(n-1), & \text{if } q(n) = +1 \\ \frac{1}{\alpha} d(n-1), & \text{if } q(n) = -1 \end{cases}.$$

8. The apparatus of claim 1, wherein the binary sequence signal q(n) comprises:

$$q(n) = \begin{cases} +1, & \text{if } |p(n)| > d(n-1) \\ -1, & \text{otherwise} \end{cases}.$$

9. The apparatus of claim 1, wherein the multiplier is controlled by the binary output signal y(n) to generate the encoding signal v(n) as follows:

$$v(n) = \begin{cases} +d(n), & \text{if } y(n) = +1 \\ -d(n), & \text{if } y(n) = -1 \end{cases}.$$

10. A method for adaptive sigma-delta modulation, comprising:
    (a) comparing an analog input signal x(n) to an encoding signal v(n) at a summing junction to generate an error signal e(n) representing a difference between the analog input signal x(n) and the encoding signal v(n);
    (b) filtering the error signal e(n) using a noise shaping filter to generate a signal p(n);
    (c) generating an absolute value of the signal p(n) at an absolute value block;
    (d) converting the signal p(n) into a binary output signal y(n) using a first one-bit quantizer;
    (e) generating a scaling signal d(n) at an adapter for scaling a step-size of the first one-bit quantizer using an estimation of the of the absolute value of the signal p(n) further comprising;
       (1) subtracting the scaling signal d(n) from the absolute value of the signal p(n) at a summing junction to generate an output signal;
       (2) converting the output signal from the summing junction into a binary sequence signal q(n) using a second one-bit quantizer;
       (3) integrating the binary sequence signal q(n) using an integrator and
       (4) converting the integrated binary sequence signal q(n) to the scaling signal d(n) using an exponential term block; and
    (f) multiplying the binary output signal y(n) by the scaling signal d(n) at a multiplier to generate the encoding signal v(n).

11. The method of claim 10, wherein the binary output signal y(n) is a representation of the analog input signal x(n) contaminated with noise created by the first one-bit quantizer.

12. The method of claim 10, wherein the generating step (d) produces both the scaling signal d(n), which is an approximation of the absolute value of the signal p(n), and a binary sequence signal q(n) from which the scaling signal d(n) can be re-generated.

13. The method of claim 10, wherein the scaling signal d(n) is used to vary the step-size of the first one-bit quantizer.

14. The method of claim 10, wherein the sealing signal d(n) is an approximation of an amplitude of the signal p(n).

15. The method of claim 10, wherein the scaling signal d(n) comprises:

$$d(n) = \alpha^{q(n)} d(n-1)$$

16. The method of claim 10, wherein the scaling signal d(n) comprises:

$$d(n) = \begin{cases} \alpha d(n-1), \text{ if } q(n) = +1 \\ \frac{1}{\alpha} d(n-1), \text{ if } q(n) = -1 \end{cases}.$$

17. The method of claim 10, wherein the binary sequence signal q(n) comprises:

$$q(n) = \begin{cases} +1, \text{ if } |p(n)| > d(n-1) \\ -1, \text{ otherwise} \end{cases}.$$

18. The method of claim 10, wherein the multiplying step (f) is controlled by the binary output signal y(n) to generate the encoding signal v(n) as follows:

$$v(n) = \begin{cases} +d(n), \text{ if } y(n) = +1 \\ -d(n), \text{ if } y(n) = -1 \end{cases}.$$

19. An apparatus for adaptive sigma-delta demodulation, comprising:
   (a) an adapter for converting a binary sequence signal q(n) received from an adaptive sigma-delta modulator to a scaling signal d(n), wherein the binary sequence signal q(n) is generated by a one-bit quantizer at the modulator and the adapter includes an integrator for integrating the binary sequence signal q(n) and an exponential term block for converting the integrated binary sequence signal q(n) to the scaling signal d(n);
   (b) a multiplier for multiplying a binary output signal y(n) received from the adaptive sigma-delta modulator by the scaling signal d(n) to generate an encoding signal v(n); and
   (c) a low-pass filter for filtering the encoding signal v(n) and for generating a signal x̂(n), which is a re-creation of an analog input signal x(n) to the modulator.

20. The apparatus of claim 19, wherein the low-pass filter filters out a shaped quantization signal from the binary output signal y(n), resulting in an approximation of the analog input signal x(n).

21. A method for adaptive sigma-delta demodulation, comprising:
   (a) converting a binary sequence signal q(n) received from an adaptive sigma-delta modulator to a scaling signal d(n) using an adapter, wherein the binary sequence signal q(n) is generated by a one-bit quantizer at the modulator and the adapter includes an integrator for integrating the binary sequence signal q(n) and an exponential term block for converting the integrated binary sequence signal q(n) to the scaling signal d(n);
   (b) multiplying a binary output signal y(n) received from the adaptive sigma-delta modulator by the scaling signal d(n) at a multiplier to generate an encoding signal v(n); and
   (c) filtering the encoding signal v(n) and generating a signal x̂(n), which is a re-creation of an analog input signal x(n) to the modulator, At a low-pass filter.

22. The method of claim 21, further comprising filtering out a shaped quantization signal from the binary output signal y(n), resulting in an approximation of the analog input signal x(n).

* * * * *